(12) United States Patent
Chumakov et al.

(10) Patent No.: US 8,946,019 B2
(45) Date of Patent: Feb. 3, 2015

(54) SEMICONDUCTOR DEVICE COMPRISING A BURIED CAPACITOR FORMED IN THE CONTACT LEVEL

(75) Inventors: Dmytro Chumakov, Dresden (DE); Tino Hertzsch, Bobritzsch (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1090 days.

(21) Appl. No.: 12/965,212

(22) Filed: Dec. 10, 2010

(65) Prior Publication Data
US 2011/0291170 A1    Dec. 1, 2011

(30) Foreign Application Priority Data

May 31, 2010   (DE) .......................... 10 2010 029 525

(51) Int. Cl.
*H01L 21/8242* (2006.01)
*H01L 27/06* (2006.01)
*H01L 23/522* (2006.01)

(52) U.S. Cl.
CPC ........ *H01L 27/0629* (2013.01); *H01L 23/5223* (2013.01)
USPC 438/241; 438/381; 257/E21.09; 257/E21.646; 257/E27.084

(58) Field of Classification Search
CPC ................ H01L 27/10855; H01L 21/76897; H01L 27/0629; H01L 23/5223
USPC ............. 257/300, E21.09, E21.646, E27.084; 438/241, 381

See application file for complete search history.

(56) References Cited

U.S. PATENT DOCUMENTS

| 4,094,057 | A | 6/1978 | Bhattacharyya et al. ........ 29/571 |
| 4,538,166 | A | 8/1985 | Nakano ........................ 357/23.6 |
| 4,871,688 | A | 10/1989 | Lowrey ........................... 437/47 |
| 6,015,990 | A * | 1/2000 | Hieda et al. .................... 257/310 |
| 2002/0094644 | A1* | 7/2002 | Chiang et al. ................. 438/279 |
| 2002/0096769 | A1* | 7/2002 | Nakazawa et al. ............. 257/751 |
| 2003/0054630 | A1* | 3/2003 | Kirchhoff ..................... 438/624 |

FOREIGN PATENT DOCUMENTS

| DE | 198 38 741 A1 | 8/1998 | ............ H01L 21/824 |
| DE | 102004004584 A1 | 8/2005 | ............ H01L 27/108 |

OTHER PUBLICATIONS

Translation of Official Communication from German Patent Office for German Patent Application No. 10 2010 029 525.6 dated Jan. 18, 2011.

Translation of Official Communication from German Patent Application No. 10 2010 029 525.6 dated Jun. 16, 2014.

\* cited by examiner

*Primary Examiner* — Colleen A Matthews
*Assistant Examiner* — Colleen E Snow
(74) *Attorney, Agent, or Firm* — Amerson Law Firm, PLLC

(57) ABSTRACT

In a semiconductor device, capacitors may be formed so as to be in direct contact with a transistor by using a shared transistor region, such as a drain region or a source region of closely spaced transistors, as one capacitor electrode, while the other capacitor electrode is provided in the form of a buried electrode in the dielectric material of the contact level. To this end, dielectric material may be deposited so as to reliably form a void, wherein, at any appropriate manufacturing stage, a capacitor dielectric material may be provided so as to separate the capacitor electrodes.

16 Claims, 7 Drawing Sheets

SEMICONDUCTOR DEVICE COMPRISING A BURIED CAPACITOR FORMED IN THE CONTACT LEVEL

BACKGROUND OF THE INVENTION

1. Field of the Invention

The present disclosure generally relates to the field of fabricating integrated circuits, and, more particularly, to capacitors, such as capacitors for dynamic random access memories (DRAM), decoupling capacitors and the like.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are reduced with the introduction of every new circuit generation, to provide currently available integrated circuits with high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance, while, however, increasing dynamic power consumption of the individual transistors. That is, due to the reduced switching time interval, the transient currents upon switching a MOS transistor element from logic low to logic high are significantly increased.

In addition to the large number of transistor elements, a plurality of passive circuit elements, such as capacitors, are typically formed in integrated circuits that are used for a plurality of purposes, such as storing information, decoupling signals and supply voltages and the like. For example, providing decoupling capacitors in integrated circuits is an important aspect for reducing the switching noise of the fast switching transistors, since the decoupling capacitor may provide energy at a specific point of the circuitry, for instance at the vicinity of a fast switching transistor, and thus reduce voltage variations caused by the high transient currents which may otherwise unduly affect the logic state represented by the transistor.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC). Furthermore, in sophisticated microcontroller devices and many other circuits including sophisticated control circuitry, an increasing amount of storage capacity may be provided on chip, thereby also significantly enhancing the overall performance of modern computer devices. For example, in typical micro-controller designs, different types of storage devices may be incorporated so as to provide an acceptable compromise between die area consumption and information storage density versus operating speed. For instance, fast or temporary memories, so-called cache memories, may be provided in the vicinity of the CPU core, wherein respective cache memories may be designed so as to allow reduced access times compared to external storage devices. Since a reduced access time for a cache memory may typically be associated with a reduced storage density thereof, the cache memories may be arranged according to a specified memory hierarchy, wherein a level 1 cache memory may represent the memory formed in accordance with the fastest available memory technology. For example, static RAM memories may be formed on the basis of registers, thereby enabling an access time determined by the switching speed of the corresponding transistors in the registers. Typically a plurality of transistors may be required so as to implement a corresponding static RAM cell, thereby significantly reducing the information storage density compared to, for instance, dynamic RAM (DRAM) memories, which include a storage capacitor in combination with a pass transistor. Thus, a higher information storage density may be achieved with DRAMs, although at an increased access time compared to static RAMs, which may nevertheless render dynamic RAMs attractive for specific less time critical applications in complex semiconductor devices. For example, typical cache memories of level 3 may be implemented in the form of dynamic RAM memories so as to enhance information density within the CPU, while only moderately sacrificing overall performance.

Frequently, the storage capacitors may be formed in the transistor level using a vertical or planar configuration. While the planar architecture may require significant silicon area, the vertical arrangement may necessitate complex patterning regimes for forming the trenches of the capacitors.

For these reasons, in other approaches, capacitors may also be implemented in the metallization system of the semiconductor device, i.e., in the metallization layers comprising metal lines and vias wherein, however, typically significant modifications of the overall process flow may be required so as to implement the metal capacitors in the metallization system and to provide the corresponding interconnect structure for connecting the metal capacitors with the circuit elements in the device level, such as transistors and the like. Consequently, also in this case, additional process modules may have to be implemented into the overall process flow, which may thus contribute to additional process complexity.

In many cases, capacitive structures may be required in the immediate vicinity of circuit elements, such as transistors, which may be accomplished in some conventional approaches, for instance in view of providing a high bit density in dynamic RAM areas by providing deep trench capacitors in the semiconductor substrate and providing corresponding transistors in and around the deep trench capacitors. As pointed out above, although a space efficient configuration may be achieved, nevertheless, extremely complicated processes, in particular for patterning the deep trenches for the capacitors in the semiconductor substrate, may be required, which may also be different for bulk devices and SOI devices, so that, in total, significant process-related variations may be introduced in complex semiconductor devices. On the other hand, providing the capacitors in the metallization system may provide additional interconnect complexity combined with sophisticated process modules for forming the capacitors independently from the regular metal interconnect structures.

The present disclosure is directed to various devices and techniques that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which capacitive structures or capacitors may be efficiently formed in the contact level of semiconductor devices, i.e., in the device level that represents an interface between the semiconductor-based circuit elements, such as the transistors, and a metallization system. The capacitors may have one capacitor electrode formed in the active semiconductor region, which may also act as a drain region or a source region of one or more transistors that may be formed in and above the active semiconductor region. Consequently, a very space-efficient configuration may be obtained since any additional interconnect structures for connecting to the electrode provided in the active semiconductor region may be avoided, since this electrode may be directly connected to a transistor. On the other hand, the second capacitor electrode may be provided in the form of a buried conductive electrode, which may be formed in the dielectric material of the contact level, which may thus efficiently cover the capacitor electrode and thus provide superior integrity thereof. Furthermore, any appropriate dielectric material, such as conventional dielectrics in the form of silicon nitride, silicon dioxide and the like, or high-k dielectric materials, i.e., dielectric materials having a dielectric constant of 10.0 or higher, or combinations of conventional dielectric materials and high-k dielectric materials may be formed between the buried capacitor electrode and the active semiconductor region, at least in an area corresponding to the capacitor, thereby enabling an efficient adjustment of the desired capacitance by selecting an appropriate material composition and layer thickness for a given geometric configuration of the semiconductor device. Hence, due to the compact configuration of the capacitor, high density memory areas, such as dynamic RAM areas, may be provided, wherein the capacitor, directly connected to a transistor, may provide the large storage capability.

The buried capacitor electrode may be formed by providing a void in the interlayer dielectric material upon depositing the dielectric material, wherein the void, which may extend along the entire width of the underlying active region, may be efficiently filled with a conductive material upon forming contact elements. In this manner, a high degree of compatibility with conventional process strategies may be achieved.

One illustrative method disclosed herein comprises forming a capacitor dielectric material on a first contact region that is formed in an active region of a semiconductor device. The method further comprises forming a dielectric material between a first gate electrode structure and a second gate electrode structure so as to provide a void in the dielectric material, wherein the first and second gate electrode structures are formed at least on the active region. The method additionally comprises forming a first contact opening in the dielectric material so as to connect to the void, wherein the first contact opening is positioned laterally outside the active region. Furthermore, the method comprises forming a second contact opening in the dielectric material so as to connect to a second contact region that is formed in the active region. Additionally, the method comprises forming a first contact element in the first contact opening, a second contact element in the second contact opening and a capacitor electrode in the void by depositing a conductive material into the first and second contact openings.

A still further illustrative method disclosed herein relates to forming a capacitive structure of a semiconductor device. The method comprises forming a first dielectric material on a shared transistor region of a first transistor and a second transistor, wherein the shared transistor region is at least one of a drain region and a source region of the first and second transistors. The method additionally comprises forming a second dielectric material above the shared transistor region and between a gate electrode structure of the first transistor and a gate electrode structure of the second transistor, wherein the dielectric material contains a void that extends along a width of the shared transistor region. Moreover, the method comprises forming a contact opening in the second dielectric material laterally outside of the shared transistor region, wherein the contact opening connects to the void. The method further comprises filling the void with a conductive material by depositing the conductive material into the contact opening.

One illustrative semiconductor device disclosed herein comprises a first transistor and a second transistor that are formed in and above a semiconductor region. The first and second transistors comprise a shared transistor region formed in the semiconductor region and positioned laterally between a gate electrode structure of the first transistor and a gate electrode structure of the second transistor. The semiconductor device further comprises a first dielectric material formed on the shared transistor region and a second dielectric material that is formed above the first dielectric material. Moreover, the semiconductor device comprises a buried capacitor electrode formed on the first dielectric material and a contact element that is formed at least in the second dielectric material and that connects to the buried capacitor electrode.

BRIEF DESCRIPTION OF THE DRAWINGS

The disclosure may be understood by reference to the following description taken in conjunction with the accompanying drawings, in which like reference numerals identify like elements, and in which.

Figure 1A:
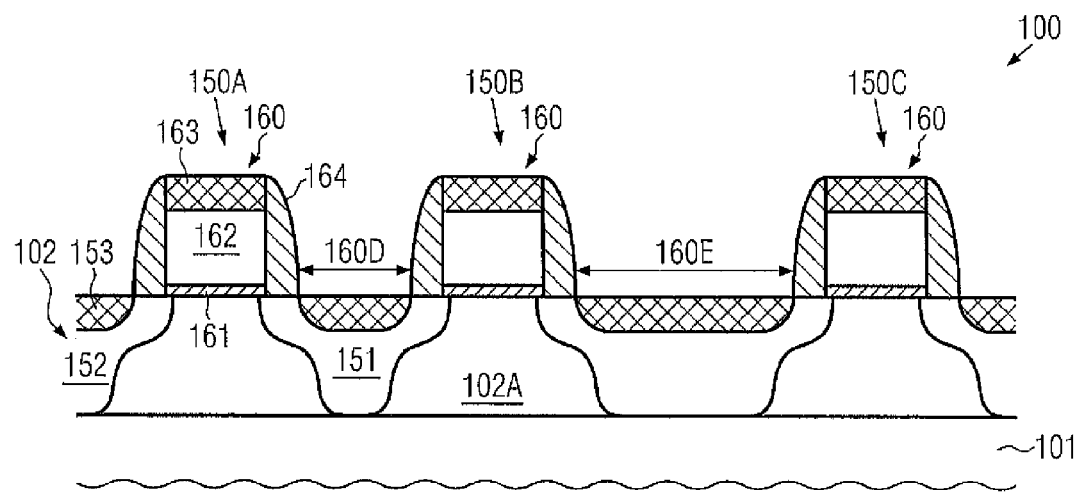
FIGS. 1a and 1b schematically illustrate a cross-sectional view and a top-view, respectively, of a semiconductor device in a manufacturing stage prior to forming a contact level, according to illustrative embodiments, wherein the cross-section of FIG. 1a is taken along a section Ia as shown in FIG. 1b.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which capacitors or capacitive structures may be provided in the contact level of semiconductor devices, wherein one capacitor electrode may be formed in the active semiconductor region, for instance in the form of drain and/or source regions of transistors, thereby avoiding any stacked capacitor configurations or deep trench capacitors, as may typically be provided in conventional approaches. Furthermore, by directly connecting one capacitor electrode with a transistor region, such as a source region or a drain region, the overall complexity of interconnect structures required in stacked capacitor configurations may be significantly reduced, thereby also providing the capacitive structures in a very space-efficient way. Furthermore, by directly connecting a transistor and a capacitor, densely packed memory areas, such as dynamic RAM arrays, may be provided, thereby achieving a high bit density without requiring complex process strategies. To this end, a buried capacitor electrode may be provided in the contact level of the semiconductor device, i.e., a significant portion of the capacitor electrode may be formed in the dielectric material of the contact level so as to be covered by this material, while electrical access to the buried capacitor electrode may be provided on the basis of appropriately positioned contact elements, which may be provided together with other contact elements that connect to other circuit elements, such as transistors and the like. The buried configuration of the capacitor electrode in the contact level of the semiconductor device may be achieved by reliably forming a void in the interlayer dielectric material at positions where the capacitor electrode is to be provided. On the other hand, at any other areas, the interlayer dielectric material may be provided in a substantially void-free manner in order to avoid any contact failures.

It has been recognized that, during the manufacturing sequence for forming contact elements in sophisticated semiconductor devices, frequently, contact failures may be observed, in particular in densely packed device regions, wherein one reason for these contact failures may be seen in the generation of buried protrusions of a contact metal, which may even form a short circuit between neighboring contact elements. A corresponding mechanism may be caused upon depositing an interlayer dielectric material in densely packed device areas, wherein the pitch between neighboring conductive lines, such as gate electrode structures, may result in the formation of any voids upon depositing the dielectric material without taking specific counter measures. That is, upon depositing the dielectric material between closely spaced gate electrode structures, a void may be formed due to the sophisticated aspect ratio defined by the space between the gate electrode structures and the height thereof, which may thus result in overhangs and an insufficient filling in of the dielectric material so that the created void may extend to a certain degree along the gate electrode structures. During the further processing, contact elements may be formed so as to connect to the gate electrode structures and the active semiconductor region, i.e., the drain and source regions of the transistors, wherein some of the corresponding contact openings may thus connect to the previously created voids, which may then also be filled with a conductive material upon depositing a contact metal. In this manner, respective contact failures may be caused, in particular in sophisticated semiconductor devices.

According to the principles disclosed herein, on the other hand, the process sequence for forming the interlayer dielectric material may be controlled such that voids may be formed in a highly controlled manner above appropriately selected transistor active regions in order to form buried capacitor electrodes upon filling contact openings with an appropriate conductive material. However, contrary to conventional contact failure mechanisms, the respective void may be formed with a high degree of controllability and the contact elements for connecting to the void are appropriately positioned so as to avoid an electrical connection to the active semiconductor region. Moreover, at any appropriate stage, a dielectric layer, i.e., a capacitor dielectric material, may be provided at the bottom of the void so as to reliably electrically isolate the buried capacitor electrode from the underlying active semiconductor region.

In some illustrative embodiments disclosed herein, the concept of providing a well-controlled void above a specified area of the active semiconductor region may be applied twice in order to form the dielectric capacitor material specifically on the transistor active regions that are concurrently acting as a capacitor electrode, while, on the other hand, any other areas of the active region may have formed thereon a portion of an interlayer dielectric material, thereby avoiding a direct contact with the capacitor dielectric material. In this manner, superior surface conditions may be achieved in the transistor regions receiving the capacitor dielectric material, while, on the other hand, any influence on the capacitor dielectric material, for instance in terms of increasing parasitic capacitance values and the like, may be reduced in other transistor active regions.

FIG. 1a schematically illustrates a cross-sectional view of a semiconductor device 100 in a manufacturing stage in which semiconductor-based circuit elements may be substantially completed. In the embodiment shown, a plurality of transistors 150A, 150B, 150C may be formed in and above a semiconductor layer 102, which may represent any appropriate semiconductor material, at least in an initial state, such as a silicon material, a silicon/germanium material, or any other appropriate semiconductor compound material that is appropriate for forming the transistors 150A, 150B, 150C. The semiconductor layer 102 may be provided above a substrate 101, such as a silicon substrate, a substrate comprising an insulating material and the like. For example, the substrate 101 and the semiconductor layer 102 may represent a silicon-on-insulator (SOI) configuration when a buried insulating layer (not shown) is formed below the semiconductor layer 102 so as to be in direct contact with the layer 102. In other cases, a crystalline semiconductor material of the substrate 101 may be provided below the semiconductor layer 102 and may thus form a bulk configuration. Typically, the semiconductor layer 102 in the manufacturing stage shown may comprise a plurality of isolation regions (not shown), as will be explained with reference to FIG. 1b, thereby defining a plurality of active regions, such as a region 102A. That is, the active region 102A is to be understood as a semiconductor region that is laterally delineated by an isolation structure, such as a shallow trench isolation, and which comprises appropriate doped regions so as to form one or more PN junctions of the transistors 150A, 150B, 150C. In the embodiment shown, the active region 102A may have any appropriate size and shape so as to accommodate the transistors 150A, 150B, 150C, while, in other cases, one of the transistors 150A, 150B, 150C, such as the transistor 150C, may be positioned laterally outside of the active region 102A.

The transistors 150A, 150B, 150C, which may also be commonly referred to as transistors 150, may comprise a gate electrode structure 160, for instance comprising a gate dielectric material 161, an electrode material 162 in combination with a material 163 and a sidewall spacer structure 164. It should be appreciated, however, that the gate electrode structures 160 may have any other appropriate configuration in accordance with the design rules and requirements for the semiconductor device 100. For example, the gate dielectric material 161 may actually comprise a high-k dielectric material, possibly in combination with a conventional dielectric material, in order to provide superior current flow controllability in the transistors 150. In this case, the electrode material 162 may comprise a metal-containing material which may be provided in close proximity to the gate dielectric material 161, for instance in the form of titanium nitride, tantalum nitride and the like, wherein also appropriate metal species may be incorporated in the material 162 and/or the dielectric material 161 in order to obtain a desired work function of the gate electrode structures 160. In the example shown, the electrode material 162 may comprise a silicon-containing material, while the material 163 may be provided in the form of a metal silicide. Similarly, the spacer structure 164, if provided, may have any appropriate configuration in terms of number of spacer elements, etch stop liners and the like. Moreover, in other illustrative embodiments, the gate electrode structures 160 may represent "replacement" gate electrode structures in which one or more of the materials shown in FIG. 1a may be replaced by other materials in a further advanced manufacturing stage, as will be described in more detail later on. The gate electrode structure 160 may have any appropriate configuration in terms of gate height and gate length, i.e., the horizontal extension of the electrode material 162 in FIG. 1a, in accordance with requirements for the transistors 150. Similarly, the transistors 150 may comprise drain and source regions 151, 152 in which appropriate contact regions 153, for instance in the form of metal silicide, may be provided. In the embodiment shown, the contact region 153 provided in the drain or source region 151 may represent a "shared" transistor region for the transistors 150A, 150B, and may also act as a capacitor electrode in combination with a buried capacitor electrode still to be formed during the further processing of the device 100. It should be noted, however, that the contact regions 153 may also be provided in the form of a highly doped semiconductor material without requiring any specific metal silicide areas, which may be formed in a locally restricted manner in a later manufacturing stage, for instance when applying a replacement gate approach and the like. In this case, the shared transistor region 153 positioned laterally between the gate electrode structures 160 of the transistors 150A, 150B may be provided as a highly doped semiconductor material and may represent a part of the shared drain or source region 151.

Furthermore, as illustrated in FIG. 1a, in some illustrative embodiments, the lateral distance between the gate electrode structures 160 of the transistors 150A, 150B, indicated by 160D, may be less compared to the lateral distance between the gate electrode structures 160 of the transistors 150B, 150C, indicated by 160E. In this manner, the deposition conditions for forming a dielectric material between the transistors 150A, 150B may be intentionally made differently compared to the conditions for the transistors 150B, 150C and any other transistor elements or circuit elements, between which a buried capacitor electrode is not to be provided. Hence, the distance 160E may correspond to a "regular" pitch between the conductive lines or gate electrode structures 160 in order to provide a substantially void-free formation of an interlayer dielectric material during the further processing, thereby avoiding any undesired contact failures, as is previously explained. On the other hand, the distance 160D may reliably result in the formation of a void between the gate electrode structures 160 of the transistors 150A, 150B, wherein a corresponding void may extend along a width direction, i.e., along a direction perpendicular to the drawing plane of FIG. 1a, corresponding to the corresponding width of the gate electrode structures 160.

Figure 1B:
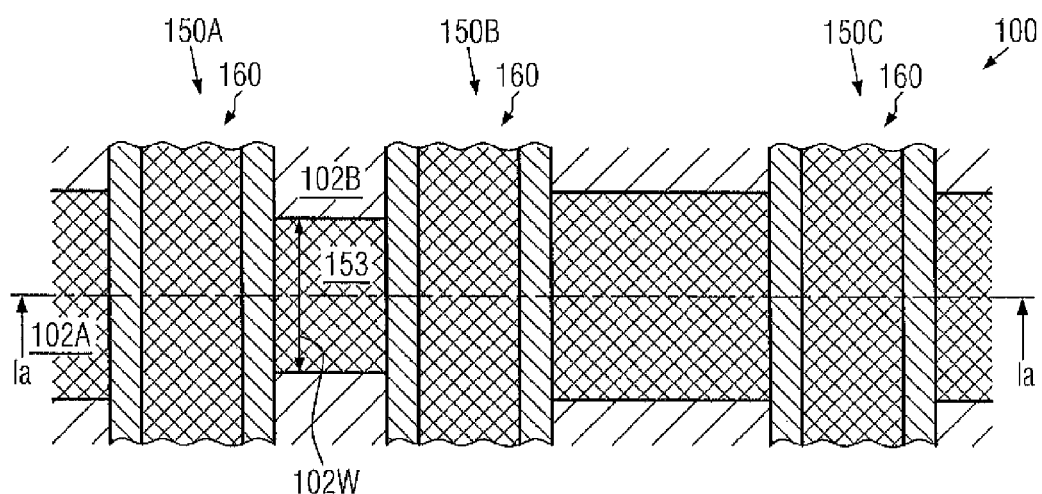

FIG. 1b schematically illustrates a top view of the device 100 wherein the line Ia indicates the section illustrated in FIG. 1a. Thus, as shown, the active region 102A including the shared transistor region 153 between the gate electrode structures 160 of the transistors 150A, 150B may be laterally delineated by an isolation structure 102B, such as a shallow trench isolation and the like. Moreover, the gate electrode structures 160 may extend across a width direction, as required by the overall device configuration. For example, the gate electrode structures 160 may extend to other active regions (not shown), if required. In one illustrative embodiment, as shown in FIG. 1b, the shared transistor region 153 may have an appropriate width 102W, which may be less than the width of the active region 102A in other device areas, thereby enabling an efficient adjustment of the overall capacitor area for a capacitor still to be formed in the semiconductor device 100. A corresponding reduction in width may be advantageous for providing a compact overall device layout upon forming contact elements that may have to connect to a buried capacitor electrode still to be formed, while, at the same time, reliably avoiding electrical contact to the active region 102A and thus to the shared transistor region 153 between the gate electrode structures 160 of the transistors 150A, 150B. In other cases, any other appropriate width 102W may be used, for instance substantially the same width as in other areas of the active region 102A, or an even increased width, as long as contact elements to be formed for the corresponding capacitor electrode may be reliably positioned laterally outside of the active region 102A.

The semiconductor device 100 as illustrated in FIGS. 1a and 1b may be formed on the basis of the following processes. The active region 102A may be formed by providing the isolation structure 102B, which may be accomplished by using well-established lithography, etch, deposition and planarization techniques when forming shallow trench isolations. When laterally delineating the active region 102A by forming the isolation structure 102B, appropriate lithography masks may be applied in order to define the lateral size and shape of the active region 102A in accordance with device requirements. For example, the width 102W may be adjusted in accordance with device requirements upon forming the isolation structure 102B. Prior to or after forming the isolation structure 102B, any appropriate well dopant species may be incorporated into the active region 102A in order to define the basic characteristics of the transistors 150. Thereafter, the gate electrode structures 160 may be formed by providing appropriate materials and patterning the resulting layer stack, wherein, as previously discussed, any appropriate materials, such as high-k dielectric materials, metal-containing electrode materials and the like, may be used. Based on sophisticated lithography and etch techniques, the gate length may be adjusted and also the lateral distances 160E, 160D may be provided as required for obtaining different process conditions during the subsequent processing of the device 100, i.e., in terms of forming an interlayer dielectric material in a later manufacturing stage. For example, the distance 160D may be selected to be approximately 100 nm and less, while the distance 160E may be greater than 100 nm, which generally depends on the overall device layout and device requirements. In combination with providing the sidewall spacer structure 164, the drain and source regions 151, 152 may be formed, for instance, by ion implantation and the like. It should be appreciated that any other additional process steps may be implemented, for instance for incorporating strain-inducing semiconductor materials and the like, in order to provide a specific strain component in portions of the active region 102A. After annealing the device 100, thereby adjusting the final dopant profile for the transistors 150, the contact regions 153 may be provided, for instance in the form of metal silicide regions, while, in other cases, the exposed portions of the drain and source regions 151, 152 provided in a highly doped manner may receive locally restricted contact regions in a later manufacturing stage. Consequently, the shared transistor region 153 formed in the drain or source regions 151 of the transistors 150A, 150B may be defined in size by the distance 160D and the width 102W, thereby also substantially defining the area of a capacitor still to be formed.

Figure 1C:
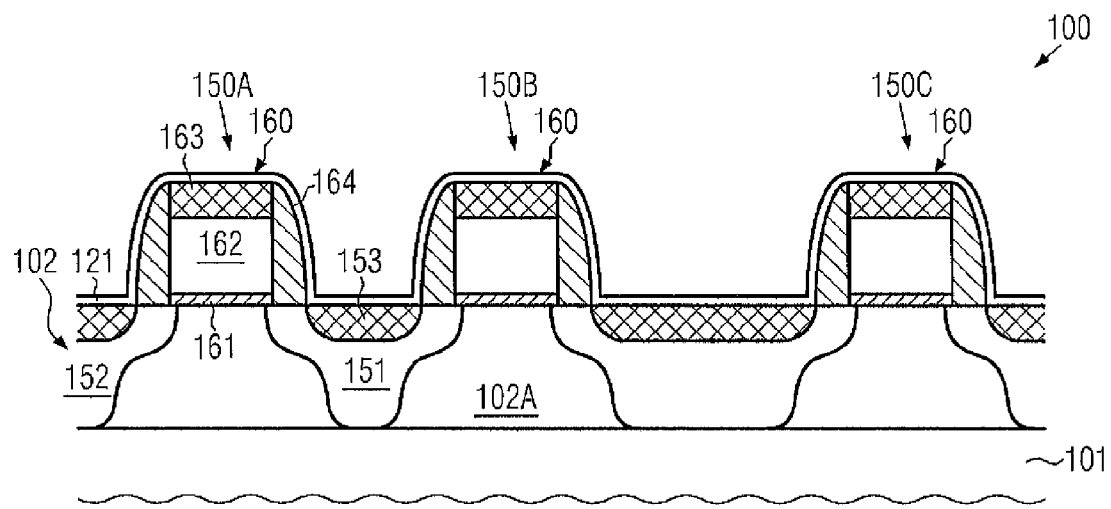
FIGS. 1c-1d schematically illustrate cross-sectional views of the semiconductor device during further advanced manufacturing stages in providing a capacitor dielectric material and a dielectric material for the contact level of the semiconductor device, according to illustrative embodiments.

FIG. 1c schematically illustrates the semiconductor device 100 with a dielectric material layer 121 formed on the active region 102A and the gate electrode structures 160. The dielectric layer 121 may be considered as a capacitor dielectric material and may thus be provided with any appropriate material composition and layer thickness in order to obtain a desired capacitance value of a capacitor still to be formed between the gate electrode structures 160 of the transistors 150A, 150B. To this end, any appropriate dielectric materials, such as silicon dioxide, silicon nitride, silicon oxynitride, or combinations thereof, high-k dielectric materials, for instance in the form of hafnium oxide, zirconium oxide, possibly in combination with other components, and the like, may be provided with a thickness of, for instance, 5 nm and less. To this purpose, any appropriate deposition technique, such as chemical vapor deposition (CVD), atomic layer deposition (ALD), which represents a CVD-like deposition process having a self-limiting deposition behavior, and the like, may be applied. Thus, in some illustrative embodiments, the dielectric material 121 is formed directly on the shared transistor region 153 provided in the drain or source region 151, and also on any other contact region 153 of the transistors 150.

Figure 1D:
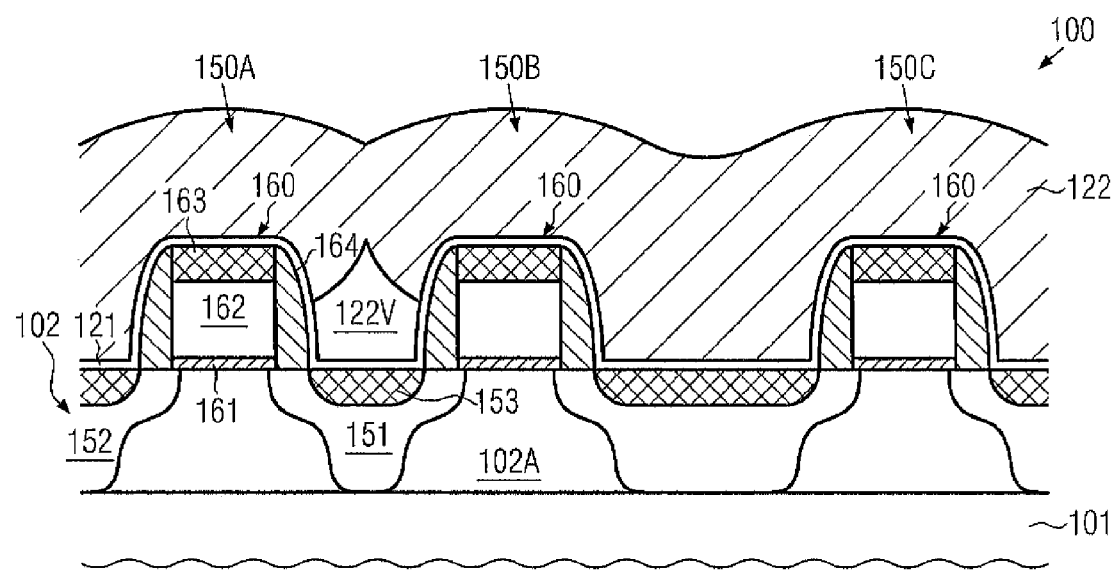

FIG. 1d schematically illustrates the device 100 in a further advanced manufacturing stage. As shown, a dielectric material 122, which may also be referred to as an interlayer dielectric material, may be formed above the transistors 150 and may be formed between the gate electrode structures 160. The dielectric material 122 may comprise one or more material layers, for instance in the form of silicon nitride, silicon dioxide and the like, depending on the overall process and device requirements. The dielectric material 122, or at least a portion thereof, may be deposited on the basis of any appropriate deposition techniques, such as plasma enhanced CVD and the like, wherein the reduced distance between the gate electrode structures 160 of the transistors 150A, 150B, may result in the creation of corresponding overhangs which may thus, upon the further advance of the deposition process, result in the formation of a void 122V positioned above the shared transistor region 153 and extending along the gate electrode structures 160 along a width direction, i.e., along a direction perpendicular to the drawing plane of FIG. 1d. On the other hand, the space between the gate electrode structures 160 of the transistors 150B, 150C may be reliably filled during the deposition of the dielectric material 122. Consequently, in this area, the creation of any voids may be substantially avoided. After the deposition of the dielectric material 122, for instance in the form of silicon dioxide and the like, a planarization process may be performed, for instance in the form of chemical mechanical polishing (CMP), etching and the like, in order to provide superior surface planarity for the further processing, i.e., patterning the dielectric material 122. To this end, any well-established process recipes may be applied.

Figure 1E:
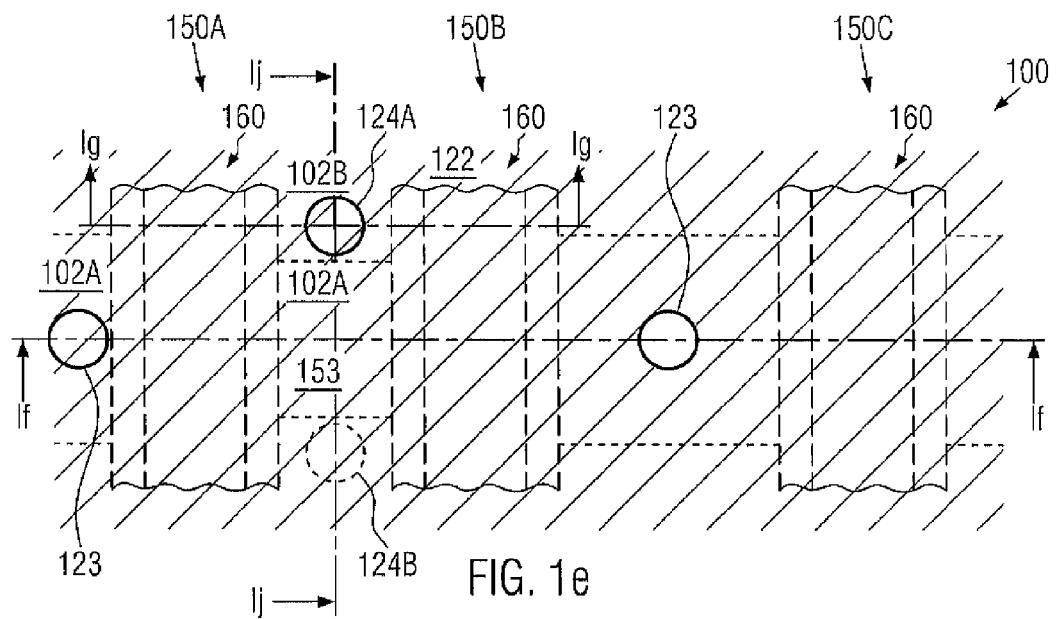
FIG. 1e schematically illustrates a top view of the semiconductor device in a further advanced manufacturing stage in which contact openings are provided in the dielectric material of the contact level, according to illustrative embodiments.

FIG. 1e schematically illustrates a top view of the semiconductor device 100 in a further advanced manufacturing stage. As illustrated, a contact opening 124A may be formed in the dielectric material 122 between the gate electrode structures 160 of the transistors 150A, 150B so as to connect to the void 122V (FIG. 1d), wherein, however, the contact opening 124A is positioned laterally outside of the active region 102A. As previously discussed, positioning the contact opening 124A laterally outside of the active region 102A and thus outside the shared transistor region 153, may be accomplished by selecting an appropriate width of the shared transistor region 153 and/or by appropriately positioning the opening 124A above the isolation structure 102B. In the embodiment shown, a compact overall device layout may be obtained by providing a reduced width, such as the width 102W as shown in FIG. 1b, while, in other cases, the width of the shared transistor region 153 may not be reduced and the contact opening 124A may be positioned more "outwardly" in the width direction in order to reliably "land" on the isolation region 102B. Moreover, in the embodiment shown, a further contact opening 124B may be provided between the gate electrode structures 160 of the transistors 150A, 150G so as to connect to the void 122V (FIG. 1*d*), while also reliably avoiding a connection to the shared transistor region 153. Providing the additional contact opening 124B may result in superior fill conditions during the further processing upon forming the buried capacitor electrode, as will be described later on in more detail.

Moreover, the device 100 may comprise further "regular" contact openings 123, for instance provided between the gate electrode structures 160 of the transistors 150B, 150C, which may connect to the active region 102A, wherein the probability of creating any contact failures may be reduced due to the reliable filling of the corresponding space by the dielectric material 122.

Figure 1F:
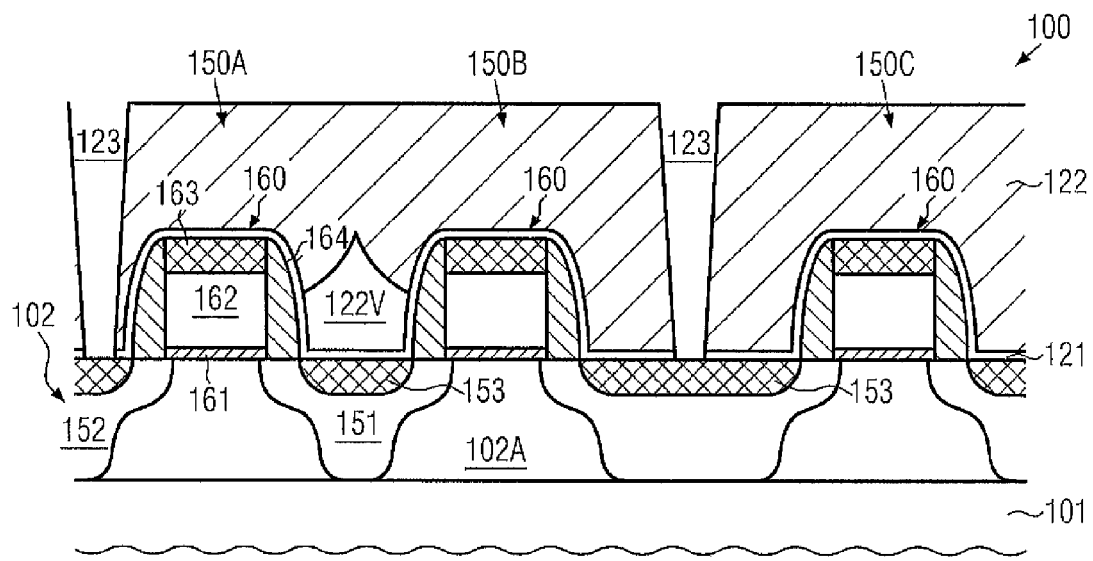
FIGS. 1f and 1g schematically illustrate cross-sectional views corresponding to the sections If and Ig of FIG. 1e, respectively.

FIG. 1*f* schematically illustrates a cross-sectional view along the line If of FIG. 1*e*. As illustrated, the contact openings 123 may extend through the dielectric material 122 and through the capacitor dielectric layer 121 so as to connect to the active region 102A, i.e., to a corresponding portion of the contact regions 153, for instance between the gate electrode structures 160 of the transistors 150B, 150C. On the other hand, the void 122V may be formed above the dielectric layer 121 between the gate electrode structures 160 of the transistors 150A, 150B.

Figure 1G:
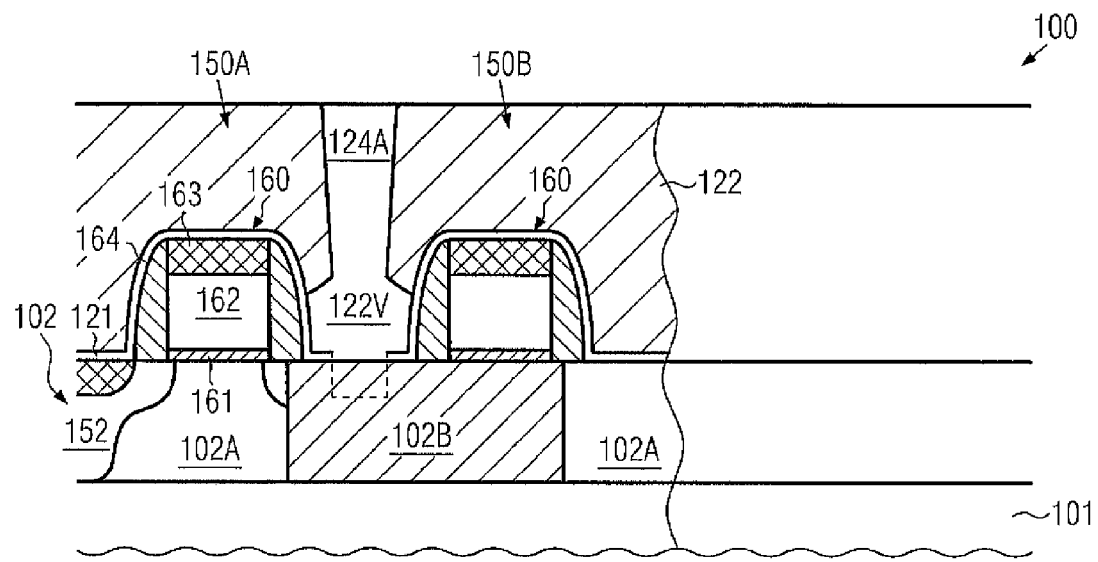

FIG. 1*g* schematically illustrates a cross-sectional view of the semiconductor device 100 taken along a section 1*g* of FIG. 1*e*. As shown, the contact opening 124A extends through the dielectric material 122 and connects to the void 122V, wherein, depending on the process conditions during the patterning of the dielectric material 122, the contact opening 124A may also extend into the isolation structure 102B, however, without contacting the active region 102A. Similarly, the contact opening 124B, if provided, (FIG. 1*e*) may connect to the void 122V.

The contact openings 123, 124A, 124B as shown in FIGS. 1*e*-1*g* may be formed on the basis of any appropriate process strategy. For example, an appropriate etch mask, such as a resist mask or a hard mask, may be formed on the dielectric material 122, possibly in combination with any anti-reflective coating (ARC) materials and the like, and may be used for etching through the dielectric material 122 and finally through the dielectric layer 121. To this end, a plurality of well-established anisotropic etch techniques are available, for instance for etching silicon dioxide, silicon nitride and the like. In some illustrative embodiments, the dielectric layer 121, i.e., the capacitor dielectric material, may be used as an efficient etch stop material when patterning the dielectric material 122. For example, a plurality of high-k dielectric materials may have a high etch resistivity compared to a plurality of well-established etch recipes. In this case, upon forming the contact openings 123 and the openings 124A, 124B, any material residues of the dielectric material 122 within the void 122V may be efficiently removed, for instance, by using a substantially isotropic etch step, thereby "increasing" the void 122V which may thus be delineated by the dielectric material 121. In this manner, a maximum area may be provided for a buried capacitor electrode to be formed in the void 122V. To this end, a plurality of wet chemical etch recipes may be applied, wherein the corresponding etch chemistry may be applied through the contact openings 124A, 124B. During this etch phase, a certain increase of lateral width of the contact openings 124 at a bottom area (not shown) may also be accomplished, thereby providing superior contact resistivity of contact elements to be formed in the openings 123. After the optional substantially isotropic etch process, the dielectric layer 121 may be opened, for instance, on the basis of a substantially anisotropic etch step, thereby avoiding removal of the dielectric material 121 above the shared transistor region 153 within the void 122V.

Figure 1H:
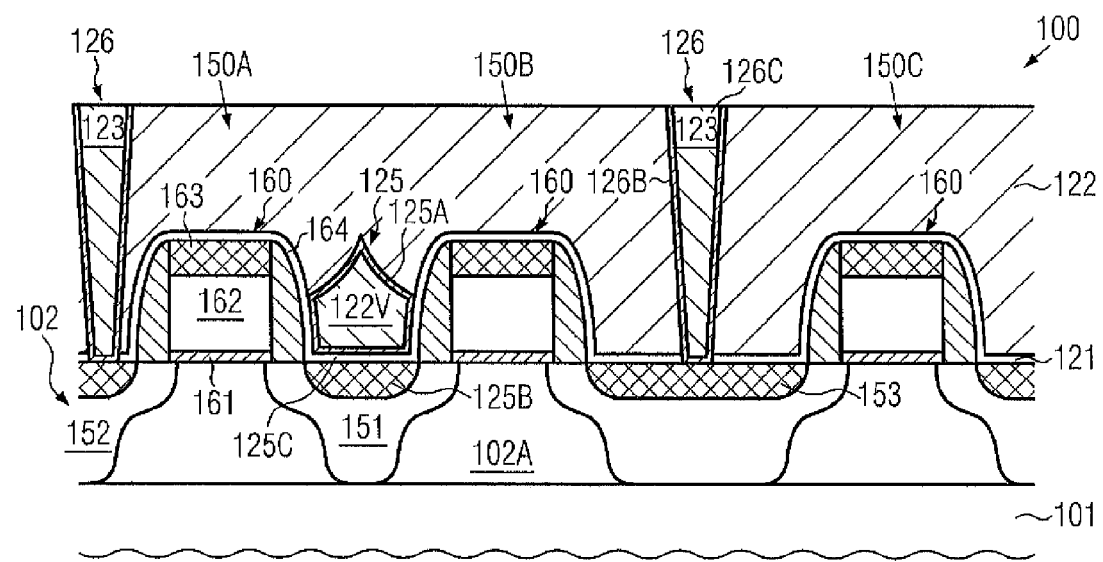
FIGS. 1h and 1i schematically illustrate cross-sectional views of the semiconductor device corresponding to the sections If and Ig of FIG. 1e in a further advanced manufacturing stage, wherein contact elements and a buried capacitor electrode may be provided in accordance with illustrative embodiments.
Figure 1I:
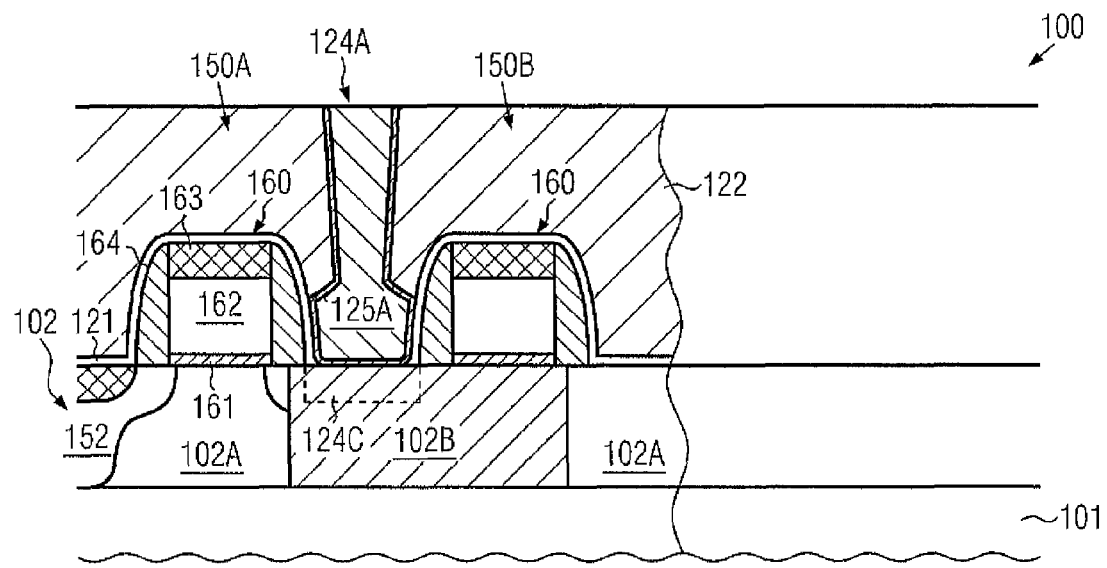
Figure 1J:
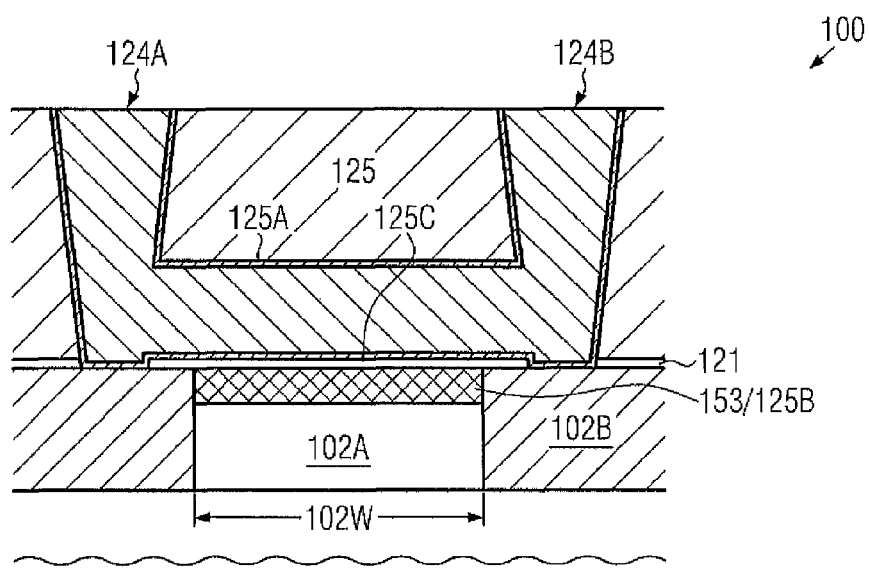
FIG. 1j schematically illustrates a cross-sectional view along the section Ij of FIG. 1e wherein a capacitor including a buried capacitor electrode may be provided according to illustrative embodiments.

FIGS. 1*h*-1*j* schematically illustrate cross-sectional views of the semiconductor device 100 in a further advanced manufacturing stage.

FIG. 1*h* schematically illustrates the device 100 in cross-sectional view along the line If of FIG. 1*e*. As illustrated, contact elements 126 may be provided within the contact openings 123 and may thus connect to the contact regions 153, for instance between the gate electrode structures 160 of the transistors 150B, 150C. The contact elements 126 may comprise any appropriate conductive material, such as tungsten, aluminum and the like, possibly in combination with any appropriate barrier material, such as titanium, titanium nitride, tantalum, tantalum nitride and the like. In the embodiment shown in FIG. 1*h*, one or more conductive barrier materials 126B and a highly conductive core material 126C are illustrated, wherein, however, any other appropriate configuration of conductive materials may be provided. Moreover, a buried capacitor electrode 125A of a capacitor 125 may be formed in the void 122V and may comprise the materials 126B, 126C in a similar manner as in the contact elements 126. Moreover, the capacitor 125 may comprise the dielectric material 121 acting as a capacitor dielectric, indicated by 125C, which may thus separate the buried capacitor electrode 125A from the contact region provided in the drain or source region 151, which may thus act as a further capacitor electrode 125B.

FIG. 1*i* schematically illustrates a section of the device 100 according to the section line Ig of FIG. 1*e*. Hence, a contact element 124A comprising the same material composition as the contact elements 126 of FIG. 1*h* and a buried capacitor electrode 125A may be provided and may thus electrically connect to the buried capacitor electrode 125A. Moreover, as illustrated in FIG. 1*i*, the buried capacitor electrode 125A may be provided above the isolation structure 102B, thereby reliably avoiding electrical contact to the active region 102A, even if the electrode 125A may extend into a portion of the isolation structure 102B, as indicated by the dashed line 124C. A corresponding protrusion of the buried capacitor electrode 125A may be caused by the previous patterning strategy for forming the corresponding contact openings, wherein the active region 102A, i.e., any contact areas formed therein, may have a different etch stop capability compared to the isolation structure 102B.

FIG. 1*j* schematically illustrates a sectional view of the device 100 according to a section Ij as illustrated in FIG. 1*e*. Thus, the section of FIG. 1*j* represents a view along the width direction of the device 100. As illustrated, the contact element 124A and the optional contact element 124B may be positioned above the isolation structure 102B and may thus be positioned laterally outside of the active region 102A, thereby avoiding electrical contact to the active region 102A. Moreover, the contact elements 124A, 124B may connect to the buried capacitor electrode 125A, which extends at least along the width 102W of the active region 102A and thus of the shared transistor region 153, which also represents the second capacitor electrode 125B, as previously explained. Consequently, the buried electrode 125A, the shared transistor region 153 or the electrode 125B in combination with the capacitor dielectric material 125C, i.e., the dielectric layer 121, may represent the actual capacitor 125 and may thus define the capacitance of the capacitor 125, which is thus determined by the lateral size of the electrode 125B, i.e., by the shared transistor region 153, and by the characteristics of the dielectric material 125C.

The semiconductor device 100 as illustrated in FIGS. 1h-1j may be formed on the basis of any appropriate process strategy. For example, after providing the contact openings 123, 124A, 124B (FIG. 1e), any appropriate deposition process or sequence of deposition processes may be applied, for instance using sputter deposition, CVD, electrochemical deposition, or any combination thereof, in order to provide one or more conductive materials, such as the materials 126B, 126C. During the deposition of these materials, also the void 122V may be efficiently filled, as is well known from conventional strategies in which unintentionally provided voids may be efficiently filled with conductive contact metals, thereby causing significant contact failures. In the embodiment shown, the buried electrode 125A may be efficiently filled from "both" sides by means of the contact openings 124A, 124B, thereby providing superior process conditions. Thereafter, any excess material may be removed, for instance by CMP and the like, in accordance with any well-established process strategy.

Consequently, the contact elements 123 and 124A, 124B may be formed on the basis of any appropriate process strategy, while at the same time reliably filling the void 122V so as to form the buried capacitor electrode 125A. On the other hand, electrical contact of the buried capacitor electrode 125A with the active region 102A may be avoided by appropriate positioning in the contact elements 124A, 124B. In this manner, the capacitor 125 may be provided in a very space-efficient way without requiring any additional process steps compared to conventional manufacturing sequences for forming a contact level, i.e., the combination of the dielectric material 122 and the contact elements 123.

With reference to FIGS. 1k-1n, further illustrative embodiments will now be described in which an influence of the capacitor dielectric material on other device areas, such as drain and source regions of transistors, may be reduced.

Figure 1K:
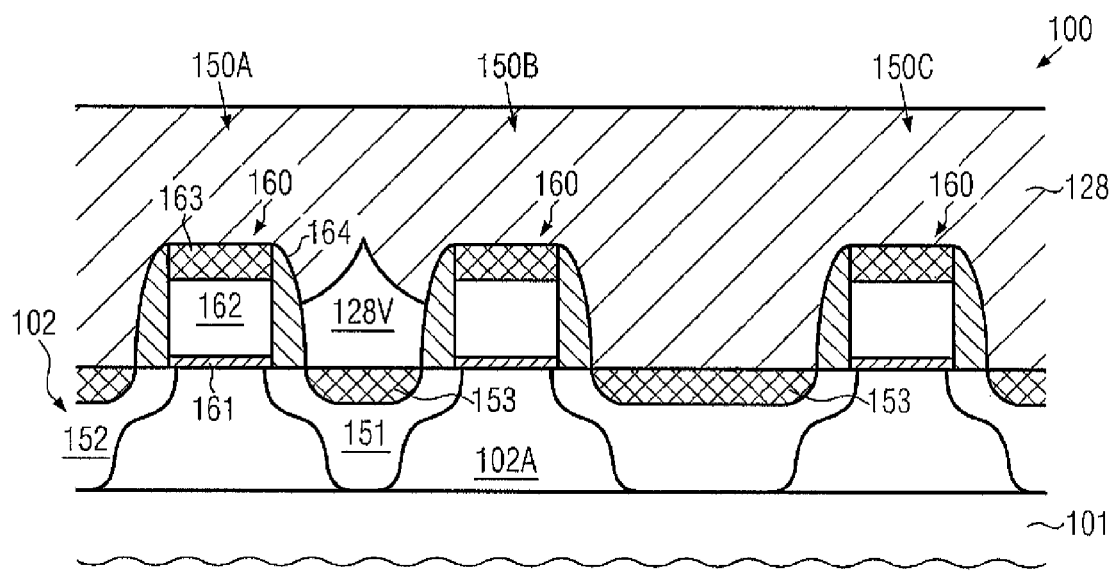
FIGS. 1k-1n schematically illustrate cross-sectional views of the semiconductor device during various manufacturing stages according to illustrative embodiments in which a capacitor dielectric material may not be directly formed on non-capacitor areas of the active semiconductor region.

FIG. 1k schematically illustrates the semiconductor device 100 with a fill material 128, which may be formed above the transistors 150 when starting from a device configuration as shown in FIG. 1a. To this end, the fill material 128 may be provided in the form of any appropriate dielectric material, such as silicon dioxide, silicon nitride and the like. As explained above, due to the geometric configuration of the gate electrode structures 160, a void 128V may be formed between the gate electrode structures 160 of the transistors 150A, 150B. After depositing the material 128, a planarization of the surface topography may be applied, if required.

Figure 1L:
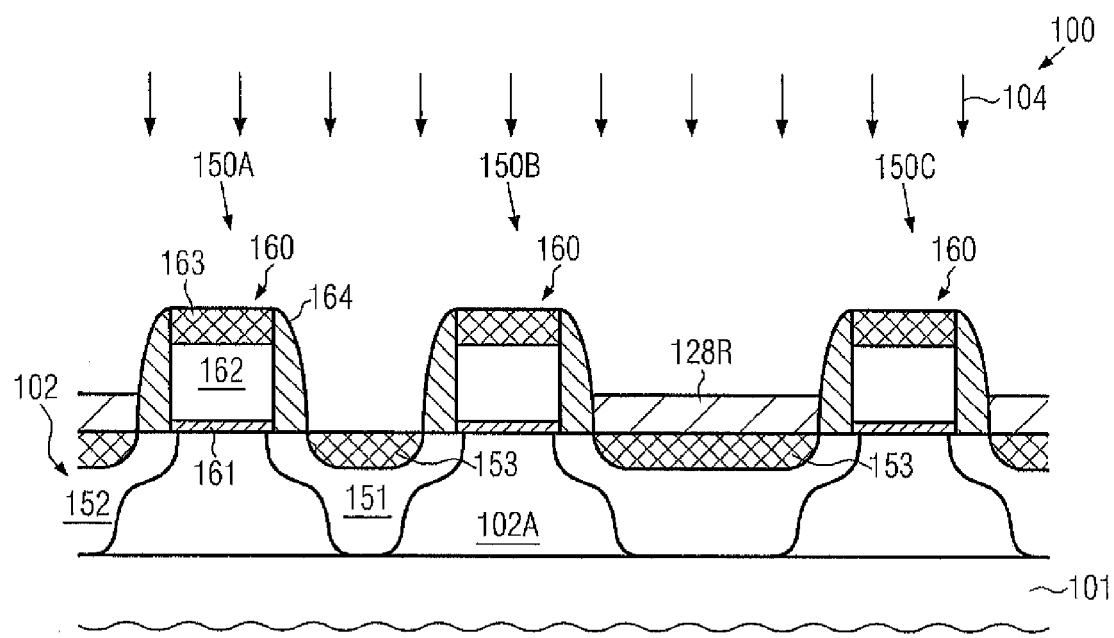

FIG. 1l schematically illustrates the semiconductor device 100 during an etch process 104 in which a portion of the material 128 (FIG. 1k) may be removed, for instance, by using wet chemical etch chemistries, plasma assisted etch chemistries or a combination thereof, wherein, however, a portion 128R may be preserved in areas in which a buried capacitor electrode is not to be formed. That is, due to the presence of the void 128V shown in FIG. 1k, the etch process 104 may result in an exposure of the shared transistor region 153 between the transistors 150A, 150B, while nevertheless other transistor areas having an increased lateral distance may remain reliably covered by the portion 128R of the previously applied fill material. To this end, a time-controlled etch process or processes may be applied in which finally the region 153 may be exposed while avoiding the exposure of any other areas of the active region 102A. In the embodiment shown, the etch process 104 may be performed on the basis of an etch chemistry which may be selective with respect to the spacer structure 164 and metal silicide, which may be provided in the gate electrode structures 160 and in portions of the active region 102A exposed by the gate electrode structures 160, as previously discussed. For example, a plurality of etch chemistries for etching silicon dioxide may have a significant selectivity with respect to silicon nitride, nickel silicide and the like.

Figure 1M:
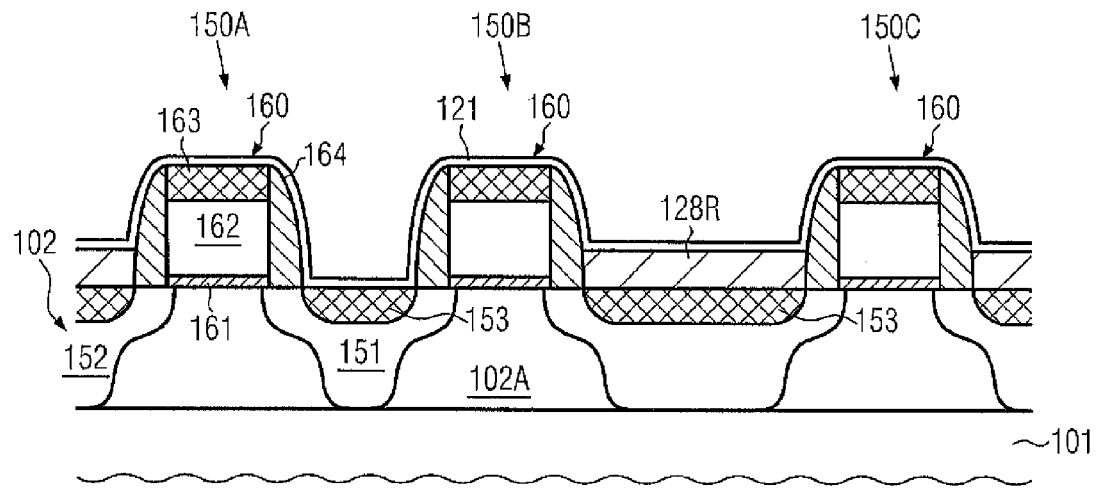

FIG. 1m schematically illustrates the semiconductor device 100 in a further advanced manufacturing stage in which the dielectric material layer 121, i.e., the capacitor dielectric material, may be formed so as to be in direct contact with the shared transistor region 153 between the transistors 150A, 150B, while in other areas the material layer 121 may be formed on the residual portion 128R. With respect to material composition and layer thickness of the material 121, the same criteria may apply as previously explained. Furthermore, any influence of the dielectric characteristics of the material 121 on other transistor areas except for the shared transistor region 153 between the transistors 150A, 150B, in which a pronounced capacitive coupling is desired, may be suppressed due to the presence of the dielectric material portion 128R.

Figure 1N:
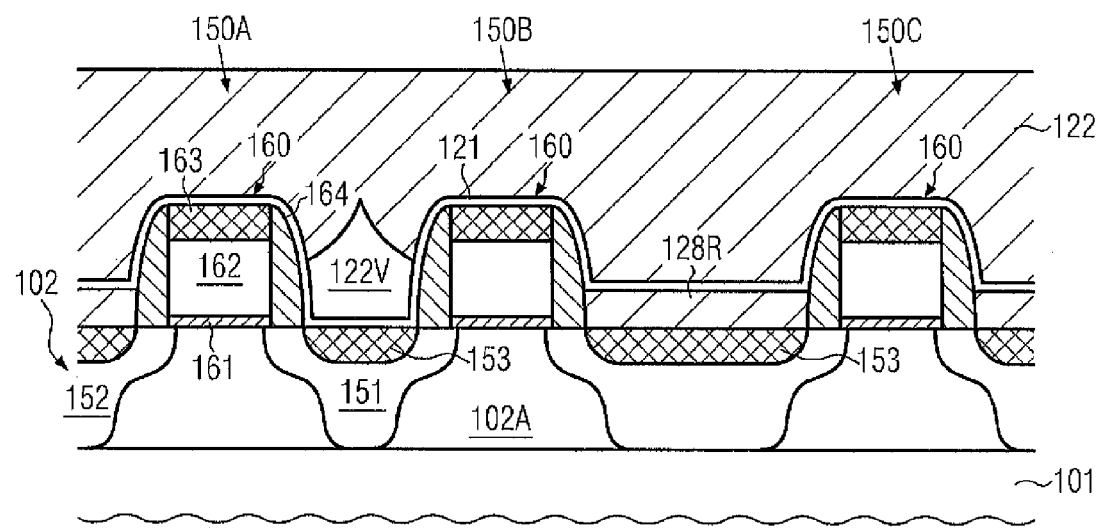

FIG. 1n schematically illustrates the semiconductor device 100 in a further advanced manufacturing stage in which the dielectric material 122, for instance in the form of one or more dielectric layers, may be provided so as to form the void 122v between the transistors 150A, 150B, as is also previously explained, while other spaces may be efficiently filled with the material 122. Thus, based on the configuration as shown in FIG. 1n, the further processing may be continued by patterning the dielectric material 122, for instance on the basis of an anisotropic etch process, wherein also the layer 121 formed above the portion 128R may be etched without requiring specific etc strategies. On the other hand, the material 121 may be opened above the isolation structure without connecting to the active region 102A, as previously discussed. In other cases, the material 121 may be used as an efficient etch stop material and material residues of the dielectric material 122 may be efficiently removed within the void 122V, substantially without affecting the remaining portions 128R, which are covered by the dielectric material 121. Thereafter, the etch process may be continued by opening the layer 121 and etching through the remaining portions 128R. Next, the resulting contact openings and the void 122V may be filled with a conductive material, as is also previously discussed.

As a result, the present disclosure provides semiconductor devices and manufacturing techniques in which a capacitor electrode may be efficiently buried in an interlayer dielectric material of a contact level of semiconductor devices, while at the same time a shared transistor region, such as a drain region or a source region, of closely spaced transistors may act as a second capacitor electrode, while an efficient dielectric material may be provided between the buried capacitor electrode and the shared transistor region. To this end, a void may be reliably formed upon depositing the interlayer dielectric material and may thereafter be filled with a conductive material, which may be introduced on the basis of contact openings, which are positioned laterally outside of the active region. In this manner, very compact transistor/capacitor configurations may be provided, for instance for providing densely packed dynamic RAM arrays and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a capacitor dielectric material on a first contact region formed in an active region of a semiconductor device;
forming a dielectric material between a first gate electrode structure and a second gate electrode structure so as to provide a void in said dielectric material, said first and second gate electrode structures formed at least on said active region;
forming a first contact opening in said dielectric material so as to connect to said void, said first contact opening being positioned laterally outside said active region;
forming a second contact opening in said dielectric material so as to connect to a second contact region formed in said active region; and
forming a first contact element in said first contact opening, a second contact element in said second contact opening and a capacitor electrode in said void by depositing a conductive material in said first and second contact openings.

2. The method of claim 1, further comprising forming said dielectric material between said second gate electrode structure and a third gate electrode structure in a substantially void-free manner.

3. The method of claim 2, wherein forming said dielectric material comprises selecting a lateral distance between said first and second gate electrode structures to be less than a lateral distance between said second gate electrode structure and said third gate electrode structure.

4. The method of claim 1, wherein forming said capacitor dielectric material comprises forming said capacitor dielectric material on said first and second contact regions.

5. The method of claim 1, wherein forming said capacitor dielectric material comprises forming a dielectric fill material above said first and second contact regions, removing a part of said dielectric fill material so as to expose said first contact region and to preserve a portion of said dielectric fill material above said second contact region and forming said capacitor dielectric material on said portion of said dielectric fill material and on said first contact region.

6. The method of claim 1, further comprising forming a third contact opening in said dielectric material so as to connect to said void.

7. The method of claim 6, further comprising selecting a lateral shape of said active region so as to position said first and third contact openings laterally outside said active region.

8. A method of forming a capacitive structure of a semiconductor device, the method comprising:
forming a first dielectric material on a shared transistor region of a first transistor and a second transistor, said shared transistor region being at least one of a drain region and a source region of said first and second transistors;
forming a second dielectric material above said shared transistor region and between a gate electrode structure of said first transistor and a gate electrode structure of said second transistor, said dielectric material containing a void extending along a width of said shared transistor region;
forming a contact opening in said second dielectric material laterally outside said shared transistor region, said contact opening connecting to said void; and
filling an entirety of said void with a conductive material by depositing said conductive material into said contact opening.

9. The method of claim 8, wherein forming said second dielectric material comprises filling a space between a gate electrode structure of a third transistor and the gate electrode structure of said second transistor with said second dielectric material.

10. The method of claim 9, wherein a lateral distance between the gate electrode structures of said first and second transistors is less than a lateral distance between the gate electrode structures of said second and third transistors.

11. The method of claim 10, further comprising forming a second contact opening in said second dielectric material between the gate electrode structures of said second and third transistors, wherein said second contact opening connects to one of a drain region and a source region of said third transistor.

12. The method of claim 8, wherein forming said first dielectric material comprises forming a fill material above said first and second transistors and selectively exposing said shared transistor region by removing a part of said fill material.

13. The method of claim 12, further comprising preserving a portion of said fill material above one of a drain region and a source region of said first transistor.

14. The method of claim 8, wherein said first dielectric material is formed with a thickness of 5 nm or less.

15. The method of claim 14, wherein said first dielectric material comprises a high-k dielectric material.

16. The method of claim 8, further comprising forming at least one further contact opening in said second dielectric material so as to connect to said void.

* * * * *